US008547169B2

(12) United States Patent
Dogan et al.

(10) Patent No.: US 8,547,169 B2
(45) Date of Patent: Oct. 1, 2013

(54) PROGRAMMABLE NOISE FILTERING FOR BIAS KICKBACK DISTURBANCES

(75) Inventors: Hakan Dogan, El Carrito, CA (US); Shahram Abdollahi-Alibeik, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/104,899

(22) Filed: May 10, 2011

(65) Prior Publication Data

US 2012/0286856 A1   Nov. 15, 2012

(51) Int. Cl.
*H03K 5/00* (2006.01)

(52) U.S. Cl.
USPC .......................................... 327/551; 327/552

(58) Field of Classification Search
USPC .................. 327/336–337, 551–559
See application file for complete search history.

(56) References Cited

U.S. PATENT DOCUMENTS

| 6,380,800 | B1 * | 4/2002 | Huber ............................. 327/552 |
| 6,414,538 | B1 | 7/2002 | Bosnyak et al. |
| 6,949,893 | B2 * | 9/2005 | Higuchi ......................... 315/312 |
| 7,218,170 | B1 * | 5/2007 | Carter et al. ................... 327/552 |
| 7,492,216 | B2 * | 2/2009 | Kurimoto et al. ............. 327/553 |
| 8,279,566 | B2 * | 10/2012 | Whitfield et al. ............... 361/56 |
| 2011/0012692 | A1 | 1/2011 | Mirzaei et al. |

FOREIGN PATENT DOCUMENTS

WO  2012154897  11/2012

OTHER PUBLICATIONS

International Search Report and Written Opinion—PCT/US2012/037180—ISA/EPO—Jul. 18, 2012.
"PCT Application No. PCT/US2012/037180, Written Opinion of the IPEA", Apr. 8, 2013, 8 pages.

* cited by examiner

*Primary Examiner* — Dinh T. Le
(74) *Attorney, Agent, or Firm* — DeLizio Gilliam, PLLC

(57) ABSTRACT

A system and method are disclosed for reducing the kickback disturbance in an electronic circuit. The system is based on the coupling of a programmable noise filter between bias blocks. In one embodiment the programmable noise filter includes capacitors, resisters and switches and forms a C-R-C circuit structure. By selecting the resistance and capacitance values and the status of the switches, the performance of the programmable noise filter is determined. Also disclosed is a system and method to reduce kickback disturbances comprising N+1 bias blocks, N programmable noise filters, and a bias reference generator, wherein N is equal to or greater than one.

17 Claims, 4 Drawing Sheets

PROGRAMMABLE NOISE FILTERING FOR BIAS KICKBACK DISTURBANCES

TECHNICAL FIELD

The present specification describes embodiments that generally relate to bias kickback disturbances in electronic circuits and specifically to embodiments utilizing noise filtering.

BACKGROUND

When a block is turned on and off in a circuit, an element of noise is generated that may "kickback" upstream to another portion of the circuit. Kickback disturbances refer to the environment where the element of noise, that usually has the shape of an impulse or spur, is connected to an output port of a circuit. The spur is coupled through that output port to other portions of the circuit, thus generating a kickback disturbance upstream in the circuit. As such, kickback disturbances may be problematic in electronic circuits because they deteriorate the performance of the electronic circuit with the kickback noise. For example, the switching operation of a comparator and/or the operation of a clocked or dynamic output latch may result in the generation of kickback noise, thereby reducing accuracy and also disturbing other circuitry. Moreover, transmitter and receiver blocks that turn on and off may cause kick-back disturbances in the main bias block. These disturbances cause bias variations in blocks such as synthesizer and phase-lock-loops that subsequently cause small drifts in the lock frequency and in the quiet blocks such as the low noise amplifiers.

Thus, it would be beneficial to have a circuit that mitigates kickback disturbances while only requiring a minimal amount of the silicon area to implement the function. Minimizing the silicon area of the circuit may minimize the cost of the silicon.

SUMMARY

A circuit is described that reduces kickback disturbances while requiring a minimal amount of silicon area to implement this function. The circuit comprises a programmable noise filter wherein the programmable noise filter is coupled between two bias blocks. In one embodiment the programmable noise filter is a PI filter, wherein the PI filter may comprise one or more capacitors, one or more resistors and one or more switches having a structure of a C-R-C filter. At least one of the one or more switches may be programmable. The performance of the programmable noise filter may be determined by the value of the resistors, capacitors and the status of the switches.

A system to reduce kickback disturbance may comprise N+1 bias blocks; N programmable noise filters, and a bias reference generator, wherein N is equal to or greater than one. The N programmable noise filters may be separately programmable.

When the output current ports of N bias blocks are coupled to one or more spurs, the system filters the kickback disturbances such that the current on output current port of N+1 bias block has a reduced kickback disturbance as compared to the spurs on the output current ports of the one or more N bias blocks.

BRIEF DESCRIPTION OF THE DRAWINGS

The components in the figures are not necessarily to scale, emphasis instead being placed upon illustrating the principles of the present specification. In the figures, like reference numerals designate corresponding parts throughout the different views.

DETAILED DESCRIPTION

In the design of electronic circuits, one objective is to reduce the amount of kickback disturbances, especially in bias circuits. If an impulse or spur is coupled to an output portion of a FET, a kickback disturbance may be generated. The amount of kickback disturbance is based on a number of factors including the characteristic of the FET, the voltages driving that FET and the frequency characteristic of the spur. For example, assume a NMOS whose gate is driven with a constant voltage by a voltage source with finite series resistance. Any MOS device may have finite parasitic capacitance between its gate-drain and gate-source junctions. Reactance of this capacitor is $1/\omega c$.

Now assume there is a voltage switching from 0-VDD at the drain with sharp rise time. The sharper the rise time, the higher the frequency components present in the signal. The higher the frequency, the lower is the reactance of the parasitic capacitor between drain and gate of the FET. This situation means that there is a relatively small impedance between drain and gate which may be approximated as a short between drain and gate. Thus, the voltage on drain during the rise time adds to the gate voltage and causes the net gate voltage to rise.

This unwanted rise in the gate voltage is called kickback noise or a kickback disturbance. The term spur refers to the noise element that initiated the kickback disturbance.

Figure 1:
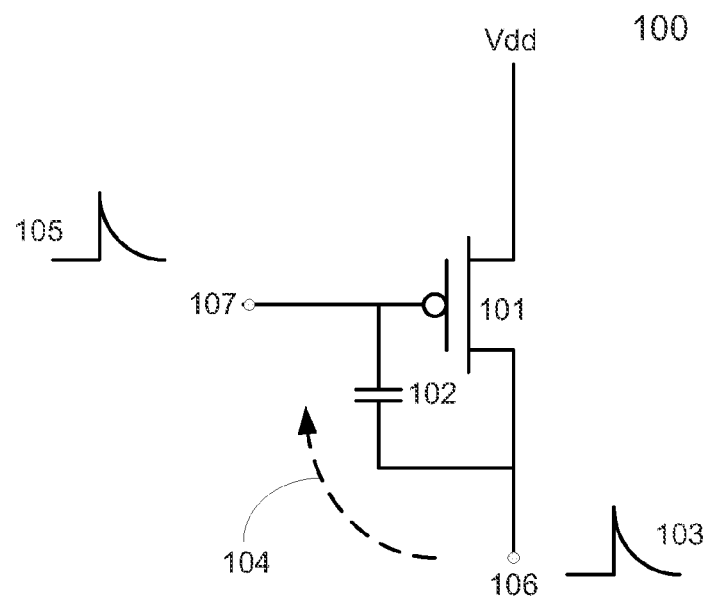
FIG. 1 illustrates a kickback disturbance in an electrical circuit.

The aforementioned situation is illustrated in embodiment 100 of FIG. 1. Embodiment 100 may be located in the bias block or bias cell of an electronic circuit. As shown, the source of the FET, PMOS 101 is driven by voltage Vdd. From an external source, a spur 103 is coupled to the drain of PMOS 101, located at bias output port 106. In turn, the spur is coupled through the parasitic capacitor 102 of PMOS 101 (see path 104). As a result, kickback disturbance 105 is generated on the gate of PMOS 101, located at bias input port 107. The magnitude of kickback disturbance 105 depends, among other things, on the frequency of spur 103, the value of Vdd and value of parasitic capacitor 102.

Figure 2:
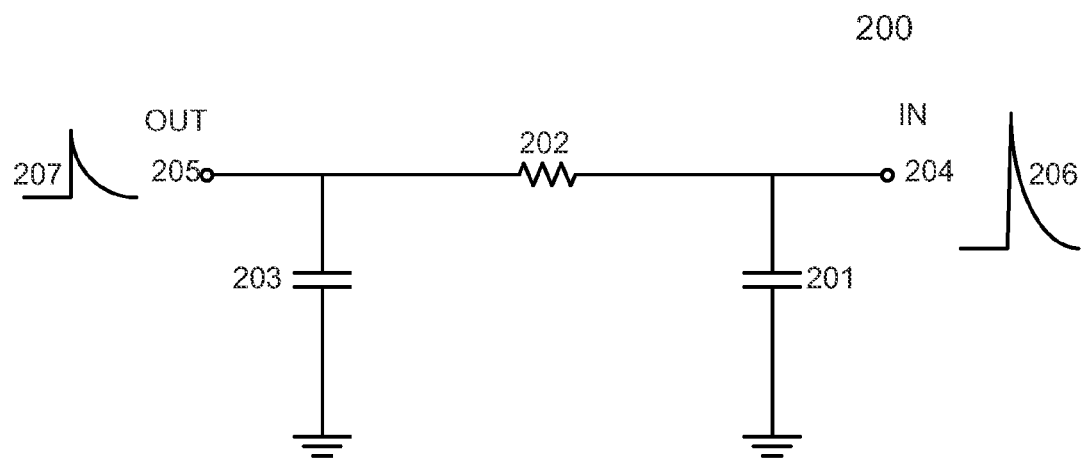
FIG. 2 illustrates the functionality of a PI circuit where the PI circuit is implemented as a C-R-C circuit.

In order to mitigate the impact of kickback disturbance 105 in other portions of the circuit, kickback disturbance 105 may be filtered. One possible filter is a PI filter, comprising capacitors and resistors. FIG. 2 illustrates one example of a PI filter as a Capacitor-Resistor-Capacitor (C-R-C) configuration. This PI filter may be coupled between two bias blocks of an electronic circuit. As shown in embodiment 200, kickback disturbance 206 is coupled to port 204. The C-R-C circuit filters the kickback disturbance 206, resulting in kickback disturbance 207 on port 205. Kickback disturbance 207 has a lower magnitude or value as compared with kickback disturbance 206.

The aforementioned C-R-C structure may mitigate the kickback disturbance in a couple of ways. First, the capacitance load at port 204 reduces the amount of kickback voltage generated. This voltage is further reduced by the R-C connection between the port 204 and port 205.

The C-R-C filter comprises capacitor 201, capacitor 203 and resistor 202. Port 204 is coupled to one end of capacitor 201 and one end of resistor 202. The other end of capacitor 201 is coupled to ground. The other end of resistor 202 is coupled to capacitor 203 and coupled to port 205. The other end of capacitor 203 is coupled to ground.

Figure 3:
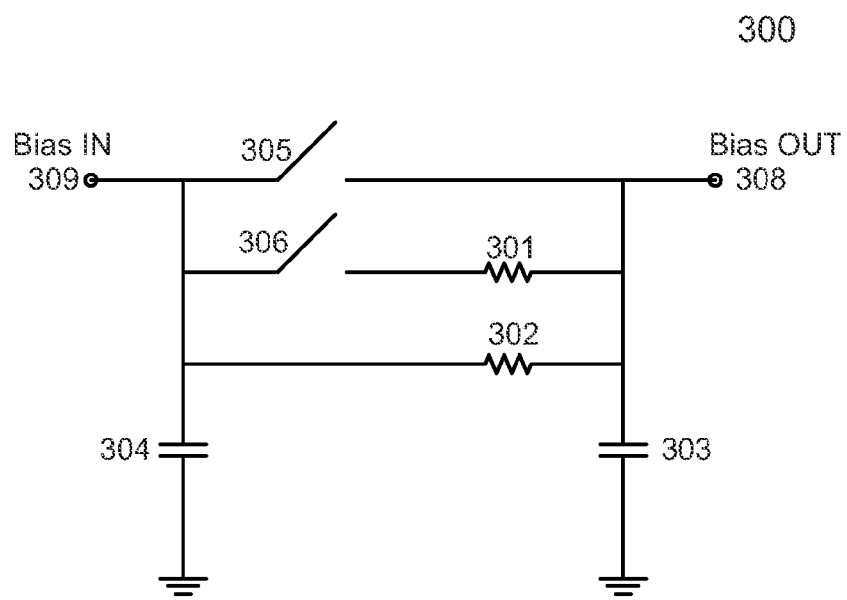
FIG. 3 illustrates an embodiment of a programmable noise filter with switches.

In order to further reduce kickback disturbances, the filter is implemented as a programmable noise filter. One embodiment is a programmable noise filter, as illustrated in FIG. 3. As shown, embodiment 300 may include resistors 301 and 302, capacitors 303 and 304 and switches 305 and 306. This embodiment 300 may implement a programmable C-R-C filter. This filter may be coupled between two bias blocks of an electronic circuit. The filter is programmed based on the settings of the switches. For example, filter characteristics are determined by the value of the resistors and capacitors and the settings of the switches. For example, larger resistance will provide better filtering, but may result in longer settling times. As resistor 301 is in parallel with resistor 302, the net resistance may be configured by opening or closing switches 305 and 306. Different net resistance values may provide different filtering characteristics. Resistor 302 may be adjusted by adding parallel resistors, or shorts. In one embodiment, the value of resistors 301 and 302 may be both either 5K ohms or 10K ohms. The value of capacitors may vary, and in one embodiment capacitor 303 and capacitor 304 may be 10 pico farads (pf).

Hence, the switches and parallel resistors in the filter are used for programming the filter. In this way, one may trade-off between the degree of filtering and the amount of time it may take for a kickback disturbance on a bias output to settle back to the original value. As previously noted, FIG. 1 illustrated a FET in a bias cell, where changes in current of bias input (port 107) may occur whenever there is spur on the bias output (port 106).

Referring to embodiment 300 of FIG. 3, the C-R-C filter is implemented as follows:

Bias OUT 308 is coupled to one end of switch 305, Bias OUT 308 is coupled to one end of resistor 301, Bias OUT 308 coupled to one end of resistor 302 and Bias OUT 308 is coupled to one end of capacitor 303. An other end of switch 305 is coupled to Bias IN 309 and the other end of switch 305 is coupled to one end of capacitor 304.

An other end of resistor 301 is coupled to one end of switch 306; an other end of resistor 302 is coupled to Bias IN 309, an other end of capacitor 303 is coupled to ground; an other end of the switch 306 is coupled to Bias IN 309; and an other end of capacitor 304 is coupled to ground.

Bias OUT 308 and Bias IN 309 are two ports of the programmable noise filter that may be coupled between two bias blocks.

The switches of embodiment 300 may be programmed manually or electronically, e.g. by a microcontroller. A person having ordinary skill in the art may recognize that embodiment 300 illustrates one possible structure for a programmable noise filter. Many alternative structures are possible. For example, although one side of capacitor 303 and 304 are shown coupled to ground in FIG. 3, the capacitors 303 and 304 may instead be coupled to an AC ground node. Persons skilled in the art will realize the relative functional equivalence of such a configuration, since the disturbances may be transient and relatively short in duration.

Figure 4A:
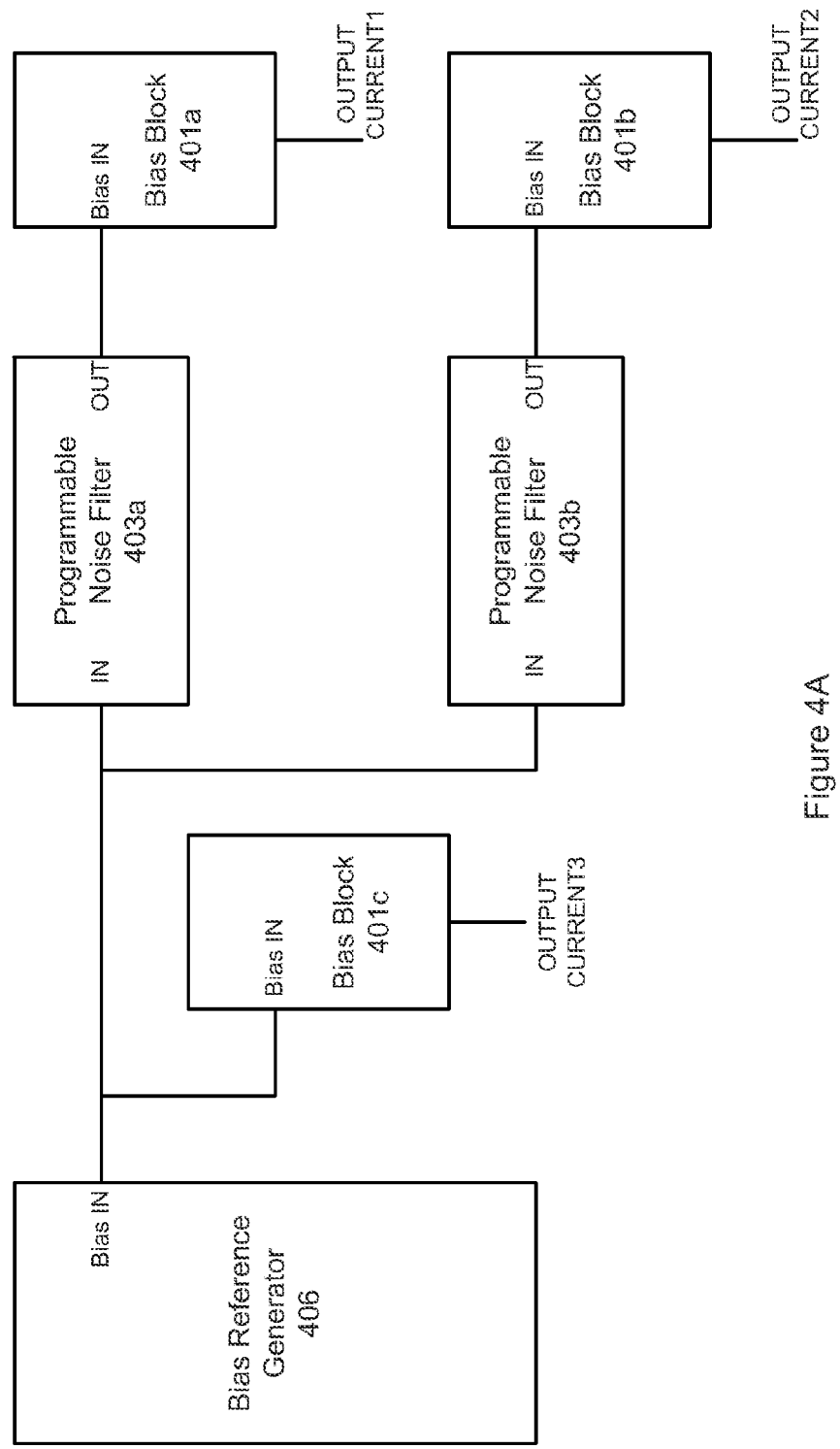
FIG. 4A illustrates a block diagram of a system that reduces kickback disturbances where the system has two programmable noise filters.

FIG. 4A illustrates a system for reducing kickback disturbance in an electronic circuit. In embodiment 400 of FIG. 4A, bias block 401a and bias block 401b are separately coupled to programmable noise filter 403a and programmable noise filter 403b.

If a spur is coupled to OUTPUT CURRENT1 of bias block 401a, then that spur may be coupled to the bias IN port of bias block 401a resulting in a kickback disturbance on the bias IN port of bias block 401a. Since the bias IN port is coupled to the OUT port of programmable noise filter 403a, the kickback disturbance is filtered by the programmable noise filter 403a. Accordingly, the kickback disturbance at the IN port of the programmable noise filter 403a is reduced as compared with the kickback disturbance at the OUT port of the programmable noise filter 403a.

Similarly, the bias IN port of bias block 401b is coupled to the OUT port of programmable noise filter 403a. Hence, if a spur is coupled to OUTPUT CURRENT2 of bias block 401b, the resulting kickback disturbance is filtered by programmable noise filter 403b. The kickback disturbance resulting on the IN port of programmable noise filter 403b is reduced as compared with the kickback disturbance at the OUT port of the programmable noise filter 403b.

Further to embodiment 400, the IN ports of programmable noise filter 403a and programmable noise filter 403b are collectively coupled to the bias IN port of bias reference generator 406 and the bias IN port of bias block 401c. Since the kickback disturbances at the IN ports of programmable noise filter 403a and programmable noise filter 403b have been reduced, the kickback disturbance on OUTPUT CURRENT3 of bias block 401c is reduced. Hence, the performance of the electronic circuit is improved. The amount of silicon area to implement the programmable noise filters is minimal.

Separating different bias branches in the manner as illustrated in embodiment 400 with filters in between isolates any noise coupling between the different blocks. Such noise coupling may be an error vector magnitude (EVM) degrading factor.

Figure 4B:
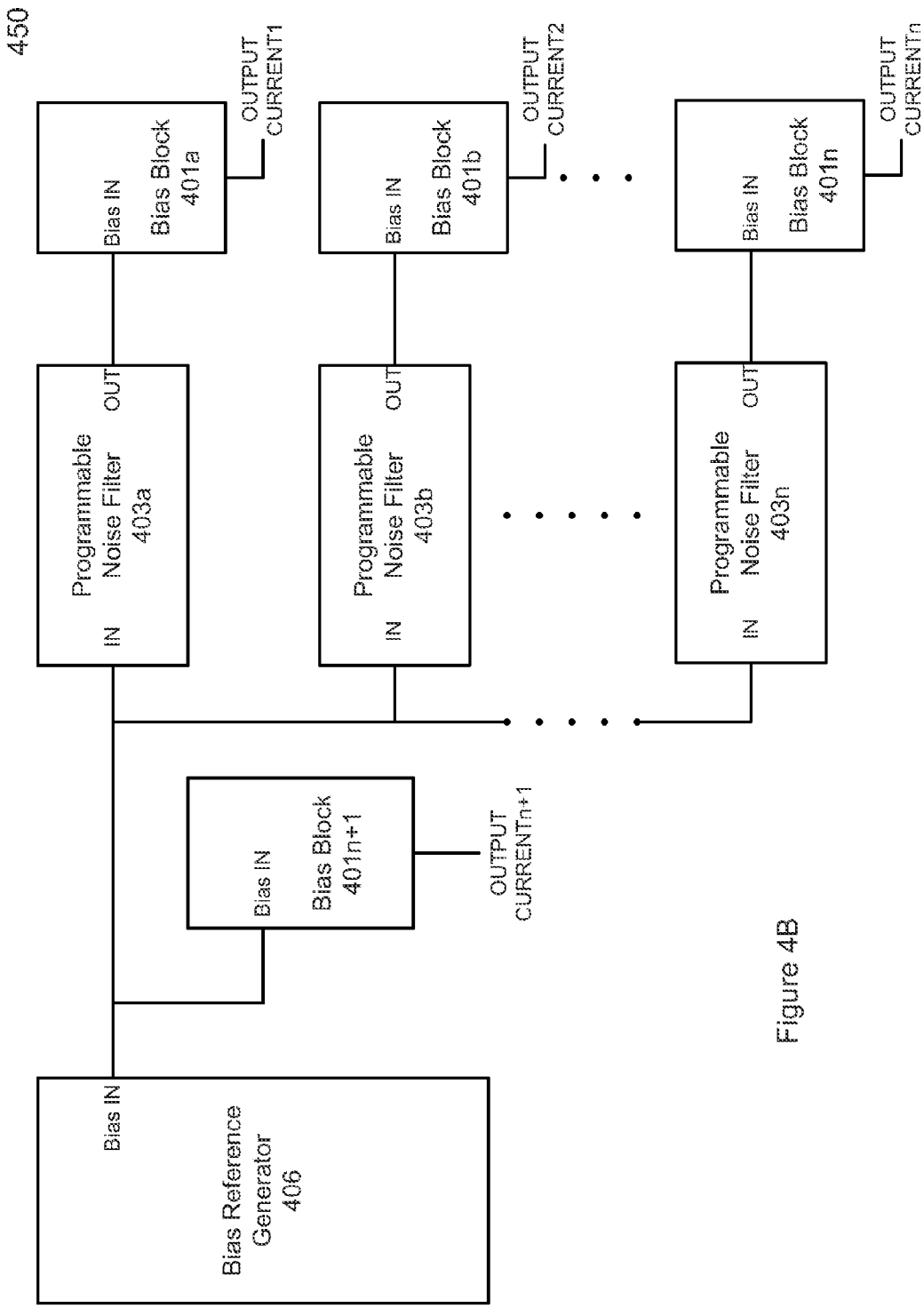
FIG. 4B illustrates a block diagram of a system that reduces kickback disturbances where the system has N programmable noise filters.

The concept of embodiment 400 may be extended to N bias blocks and N programmable noise filters. With this extension, the kickback disturbance may be further reduced in the electronic circuit. Per FIG. 4B, embodiment 450 illustrates a block diagram of a system that reduces kickback disturbances where the system has N programmable noise filters that supports N+1 bias blocks. Embodiment 450 comprises bias block 401a, bias block 401b through bias block 401n, having ports OUTPUT CURRENT1, OUTPUT CURRENT2 through OUTPUT CURRENTn, respectively. Each of the bias blocks may have a bias IN port, as illustrated The bias IN port of each of the respective bias blocks is separately coupled to the OUT port of programmable noise filter 403a through programmable noise filter 403n, respectively. The IN port of programmable noise filter 403a through programmable noise filter 403n are collectively coupled to the bias IN ports of bias reference generator 406 and the bias IN port of bias block 401n+1.

A alternative description of embodiment 450 is as follows:

A system to reduce kickback disturbance comprises N+1 bias blocks, N programmable noise filters, and a bias reference generator, wherein N is equal to or greater than one. The system further comprises a bias IN port on each of the N bias blocks that are separately coupled to an OUT port on each of the N programmable noise filters, such that the bias IN port of the Nth bias block is coupled to the OUT port of the Nth programmable noise filter. Additionally, an IN port of each of the N programmable noise filters are collectively coupled to a bias IN port of the bias reference generator and the bias IN port of the N+1th bias block. The N programmable noise filters are separately programmable.

In operation, the output current ports of N bias blocks are coupled to one or more spurs. The system improves the performance since the current on output current port of N+1 bias block has a reduced kickback disturbance as compared to the one or more spurs on the output current port of the N bias blocks.

In one embodiment (400), N=2 and the two N programmable noise filters are separately programmable.

A method for reducing kickback disturbances comprising the steps of:
  programming N programmable noise filters, wherein each of the N programmable noise filters are coupled between bias blocks, wherein N is equal to or great than one;
  receiving a spur at output current port of one or more N bias blocks;
  generating a kickback disturbance at bias IN port of the one or more N bias blocks;
  coupling bias IN port of a first bias block to a OUT port of a first programmable noise filter, and repeating the coupling until the bias IN port of the Nth bias block is coupled to the Nth OUT port of Nth programmable noise filter;
  filtering the kickback disturbance in the one or more N programmable noise filters;
  coupling collectively filtered kickback disturbances from the IN ports of the N programmable noise filters to (1) a bias IN port of a bias reference generator and (2) a bias IN port of a N+1 bias block; and
  receiving a current signal at output current port of the N+1 bias block that has a reduced kickback disturbance as compared to spurs received at the output current port of the one or more N bias blocks.

Figure 5:
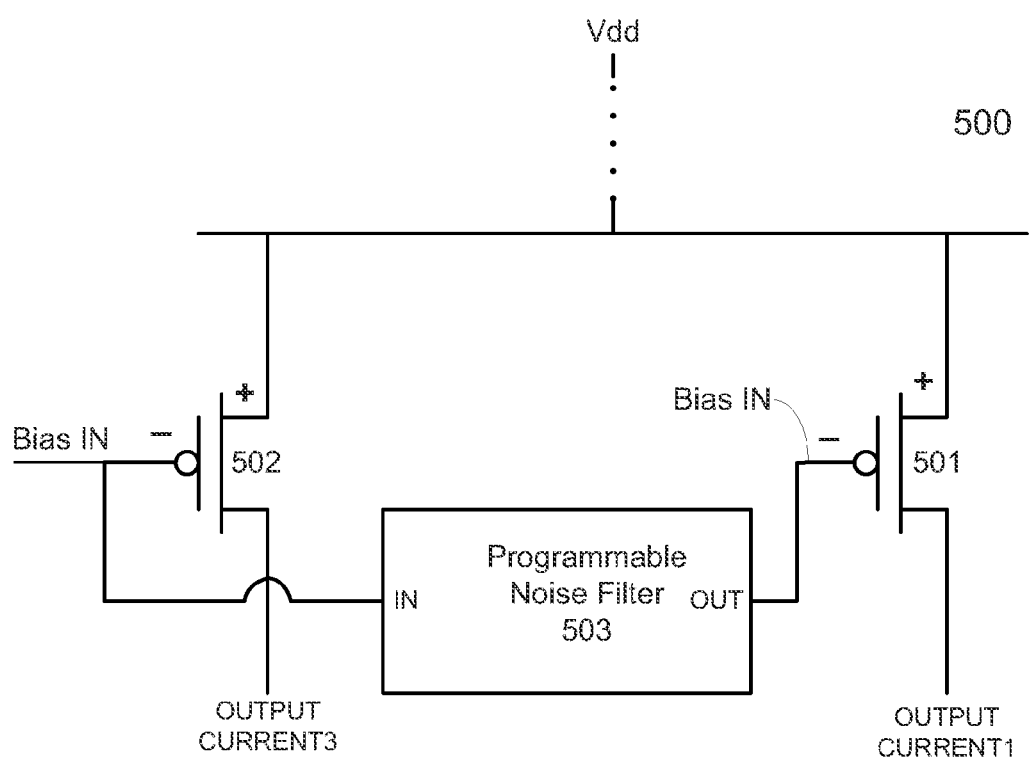
FIG. 5 illustrates an embodiment of the Specification that shows a current mirror circuit.

The programmable noise filter may also be used to reduce kickback disturbances in current mirror circuits. FIG. 5 illustrates embodiment 500 where the programmable noise filter 503 is coupled in the middle of a current mirror. By themselves, PMOS 501 and PMOS 502 would be configured to implement a current mirror if their gates were coupled together. A current mirror is a circuit designed to copy a current through one active device by controlling the current in another active device of a circuit, keeping the output current constant regardless of loading. A current mirror allows a designer to copy currents based on a single reference.

In embodiment 500, the gate of the output portion of the current mirror (PMOS 501) is coupled to the OUT of programmable noise filter 503. Hence, if a spur is coupled to OUTPUT CURRENT1, resulting in a kickback disturbance on the gate of PMOS 501, then the kickback disturbance may be filtered by programmable noise filter 503. The filtered kickback disturbance is coupled to the gate of PMOS 502 (bias IN) resulting in an improved signal on OUTPUT CURRENT3. The drains of PMOS 501 and PMOS 502 are coupled to power supply Vdd.

A person of ordinary skill in the art may recognize the relationship between the blocks of FIG. 4A and FIG. 5. PMOS 501 is a is a FET from bias block 401*a*, PMOS 502 is a FET from bias block 401*c*, and programmable noise filter 503 is equivalent to programmable noise filter 403*a*.

In summary, a circuit has been described that reduces kickback disturbances in a current mirror. The circuit comprises a programmable noise filter wherein the programmable noise filter is coupled between the gates of the FETs of the current mirror. As described for embodiment 500, the programmable noise filter 503 has mitigated the impact of kickback disturbance for the upstream reference current.

While various embodiments of the Specification have been described, it will be apparent to those of ordinary skill in the art that many more embodiments and implementations are possible that are within the scope of this Specification. For example, any combination of any of the systems or methods described in this disclosure is possible.

What is claimed is:

1. A circuit to reduce an output kickback disturbance comprising:
  a bias input port;
  a bias output port configured to receive the output kickback disturbance; and
  a noise filter coupled between the bias input port and the bias output port, the output kickback disturbance is to flow upstream from the bias output port of a circuit in a direction of the bias input port of the circuit through the noise filter,
  wherein the noise filter is configured to reduce the output kickback disturbance such that a magnitude of an input kickback disturbance at the bias input port is lower than a magnitude of the output kickback disturbance coupled to the bias output port.

2. The circuit as in claim 1 wherein the noise filter is a PI filter.

3. The circuit as in claim 2 wherein the PI filter comprises one or more capacitors, one or more resistors and one or more switches, wherein the PI filter is a C-R-C (Capacitor-Resistor-Capacitor) filter.

4. The circuit as in claim 1, wherein the noise filter is programmable to adjust a level of filtering of noise based on an activation setting of at least one switch in the noise filter, wherein the at least one switch comprises a first switch and a second switch, wherein the noise filter comprises:
  a first port coupled to one end of the first switch, the first port coupled to one end of a first resistor, the first port coupled to one end of a second resistor and the first port coupled to one end of a first capacitor;
  an other end of the first resistor coupled to one end of the second switch;
  an other end of the second resistor coupled to a second port;
  an other end of the first capacitor coupled to ground;
  an other end of the first switch coupled to the second port and the other end of the first switch coupled to one end of a second capacitor;
  an other end of the second switch coupled to the second port; and
  an other end of the second capacitor coupled to ground.

5. The circuit as in claim 4 wherein the activation setting of the at least one switch determines, in part, performance of the noise filter.

6. The circuit as in claim 3 wherein value of the one or more resistors and one or more capacitors determines, in part, performance of the noise filter.

7. The circuit as in claim 6 wherein value of the first resistor and value of the second resistor is either 5K ohms or 10K ohms.

8. The circuit as in claim 6 wherein value of the first capacitor and the second capacitor is 10 pF.

9. A system comprising:
  N+1 bias blocks comprising a group of N bias blocks and a separate bias block, wherein each of the N+1 bias blocks comprise a bias output port and a bias input port, wherein at least one bias output port of the N+1 bias blocks is configured to receive a first output kickback disturbance;

N noise filters, wherein a bias input port of each bias block in the group of N bias blocks is coupled to an output of an associated noise filter of the N noise filters; and a bias reference generator having a bias input port, wherein an input of each of the N noise filters is coupled to the bias input port of the bias reference generator and the bias input port of the separate bias block, wherein the first output kickback disturbance is to flow upstream from the at least one bias output port of the N+1 bias blocks through the N noise filters to the bias input port of the bias reference generator and the bias input port of the separate bias block, wherein N is equal to or greater than one, wherein the at least one of the N noise filters is configured to reduce the first output kickback disturbance such that a magnitude of a second output kickback disturbance at the bias output port of the separate bias block is lower than a magnitude of the first output kickback disturbance coupled to the at least one bias output port of the group of N bias blocks.

10. The system as in claim 9 where in the N noise filters are separately programmable based on a control of an activation setting of at least one switch in the N noise filters.

11. The system as in claim 9 wherein N=2 and the N noise filters are separately programmable based on a control of an activation setting of at least one switch in the N noise filters.

12. A method for reducing an output kickback disturbance comprising:

generating, during operation of a circuit having N noise filters, a bias input port, and a bias output port, the output kickback disturbance at the bias output port of a circuit, wherein the output kickback disturbance is to flow upstream in a direction to the bias input port of the circuit through the N noise filters;

filtering the output kickback disturbance using the N noise filters; and receiving a current signal at the bias input port such that a magnitude of an input kickback disturbance at the bias input port is lower than a magnitude of the output kickback disturbance coupled to the bias output port.

13. A circuit to reduce an output kickback disturbance, the circuit comprising:

a current mirror comprising, a first FET (Field Effect Transistor) having a first gate;

a second FET having a second gate and a second drain configured to receive the output kickback disturbance; and a noise filter coupled between the first gate and the second gate, wherein the output kickback disturbance is to flow upstream from the second gate in a direction of the first gate through the noise filter, wherein the noise filter is configured to reduce the output kickback disturbance such that a magnitude of an input kickback disturbance at the first gate is lower than a magnitude of the output kickback disturbance coupled to the second drain.

14. The method of 12 further comprising, prior to the operation of the circuit, programming the N noise filters, wherein N is equal to or greater than one, and wherein the N noise filters are programmable to adjust a level of filtering of noise based an activation setting of at least one switch in the N noise filters.

15. The method as in claim 14 wherein at least one of the N noise filters comprises a PI filter.

16. The method as in claim 15 wherein the PI filter comprises one or more capacitors, one or more resistors and one or more switches, wherein the PI filter is a C-R-C (Capacitor-Resistor-Capacitor) filter.

17. The circuit of claim 13 wherein the noise filter is programmable to adjust a level of filtering of noise based an activation setting of at least one switch in the noise filter.

* * * * *